(12) United States Patent
Malone et al.

(10) Patent No.: US 9,003,821 B2
(45) Date of Patent: Apr. 14, 2015

(54) BLENDED WATER-BASED DATA CENTER COOLING

(75) Inventors: Christopher G. Malone, Mountain View, CA (US); Jimmy Clidaras, Los Altos, CA (US); Michael C. Ryan, San Jose, CA (US)

(73) Assignee: Exaflop LLC, Mountain View, CA (US)

( * ) Notice: Subject to any disclaimer, the term of this patent is extended or adjusted under 35 U.S.C. 154(b) by 713 days.

(21) Appl. No.: 13/058,576

(22) PCT Filed: Feb. 1, 2011

(86) PCT No.: PCT/US2011/023350
§ 371 (c)(1),
(2), (4) Date: Feb. 11, 2011

(87) PCT Pub. No.: WO2011/097232
PCT Pub. Date: Aug. 11, 2011

(65) Prior Publication Data
US 2011/0239671 A1    Oct. 6, 2011

Related U.S. Application Data

(60) Provisional application No. 61/300,821, filed on Feb. 2, 2010.

(51) Int. Cl.
*F25D 23/12* (2006.01)
*H05K 7/20* (2006.01)

(52) U.S. Cl.
CPC .................................. *H05K 7/2079* (2013.01)

(58) Field of Classification Search
USPC ................ 62/185, 259.2, 179, 180, 183, 201
See application file for complete search history.

(56) References Cited

U.S. PATENT DOCUMENTS

| 4,457,358 | A | * | 7/1984 | Kriege et al. | 165/50 |
| 4,483,152 | A | * | 11/1984 | Bitondo | 62/175 |
| 4,495,777 | A | * | 1/1985 | Babington | 62/185 |
| 5,040,377 | A | * | 8/1991 | Braun et al. | 62/183 |
| 6,769,258 | B2 | | 8/2004 | Pierson | |
| 6,786,056 | B2 | | 9/2004 | Bash et al. | |
| 6,976,524 | B2 | * | 12/2005 | Walsh | 165/63 |

(Continued)

OTHER PUBLICATIONS

Notification of Transmittal of the International Search Report and the Written Opinion of the International Searching Authority, or Declaration (1 page); International Search Report (2 pages); and Written Opinion of the International Searching Authority (5 pages), mailed Mar. 25, 2011, for related international application PCT/US2011/023350.

*Primary Examiner* — Mohammad M Ali
*Assistant Examiner* — Raheena Rehman
(74) *Attorney, Agent, or Firm* — Fish & Richardson P.C.

(57) ABSTRACT

A method of providing cooling by a cooling system to a computer data center. The method includes providing a plurality of air-and-water radiators and one or more chillers, the chillers each having a first side in fluid communication with a chilled water loop and a second side in communication with a condenser water loop. The method also includes circulating a first portion of return water coming from the computer data center to a first subset of the air-and-water radiators and through the condenser water loop, circulating a second portion of the return water from the computer data center to a second subset of the air-and-water radiators and through the chilled water loop, and circulating the first portion and the second portion of the return water to the computer data center as cooled supply water.

20 Claims, 12 Drawing Sheets

(56) References Cited

U.S. PATENT DOCUMENTS

| | | | |
|---|---|---|---|
| 7,864,530 B1* | 1/2011 | Hamburgen et al. | 361/700 |
| 8,223,495 B1* | 7/2012 | Carlson et al. | 361/701 |
| 2004/0148950 A1* | 8/2004 | Catzel | 62/180 |
| 2008/0029250 A1* | 2/2008 | Carlson et al. | 165/104.33 |
| 2009/0007591 A1 | 1/2009 | Bean et al. | |
| 2009/0126909 A1 | 5/2009 | Ellsworth, Jr. et al. | |
| 2009/0171512 A1 | 7/2009 | Duncan | |
| 2009/0201645 A1* | 8/2009 | Kashirajima et al. | 361/700 |
| 2009/0241578 A1* | 10/2009 | Carlson et al. | 62/259.2 |

* cited by examiner

BLENDED WATER-BASED DATA CENTER COOLING

CLAIM OF PRIORITY

This application is a National Stage application under 35 U.S.C. §371 and claims the benefit of International Application No. PCT/US2011/023350, filed Feb. 1, 2011, which claims priority to U.S. Provisional Patent Application Ser. No. 61/300,821, filed on Feb. 2, 2010, entitled BLENDED WATER-BASED DATA CENTER COOLING, the entire contents of both applications are hereby incorporated by reference.

TECHNICAL FIELD

This specification relates to providing utilities such cooling to a data center.

BACKGROUND

Computer data centers are large commercial buildings that house a very large number of computers, such as thousands or tens of thousands of rack-mounted computer servers and other computing equipment (e.g., storage devices, power supplies, and networking equipment). Generally, computer data centers provide computing services, such as web page hosting, search, e-mail, video, and other services, to a number of distributed remote users.

Because internet-connected users have grown enormously in numbers, and the types of services they demand have grown enormously in complexity, data centers must now provide a quickly increasing amount of computing resources. As a result, the size of data centers has increased, the number of data centers has increased, and because data centers require the use of electronic equipment, the electrical demands of data centers have increased. Because the electricity used by data centers is turned into heat, the cooling demands of data centers have increased significantly also.

SUMMARY

This document discusses various mechanisms and techniques for providing cooling to computer data centers. In general, the specification discusses providing a cooling system in which warm return water from the data center can be run alternatively to chilled water sides of chillers that service the data center, and also to radiators that service the chillers. The relative amount of return water that is routed through each may be modulated by control valves based on the level of load that is imposed on the system. For example, on relatively cool days, all of the data center return water may be routed through the radiators and then returned to the data center, effectively providing free cooling, or an air-side economizer mode. On a very warm day and/or when the electronic equipment in the data center is imposing a high cooling load, all of the return water may be routed through the chillers, and the radiators may be isolated on the condenser water side of the chillers, so that effectively, there are two traditional loops—a chilled water loop and a condenser water loop. On days in between, banks of radiators may be switched from serving the chillers directly or serving the data center directly without intervention of the chillers. Likewise, corresponding chillers may be energized or de-energized in coordination with the switching of fluid flow to the radiators.

The systems and techniques described here may provide one or more advantages. In appropriate geographic areas and environments or climates, such a system may operate by the lowest costs (lower net power consumption) than are allowable using other cooling techniques. For example, rather than simply turning chillers down or recirculating much of the data center water and running the rest through the chillers that are currently required, the chillers as described herein can be taken out of the system, and mid-level cooling can be provided by the radiators alone rather than simply by a small number of throttled-back chillers. On high-load days (e.g., when the outdoor dry-bulb temperature is relative high), the data center can still be operated adequately, though with the chillers handling most or all of the water from the data center. And on days in which the load is at a middle level, the system may be staged up or down to match the load, so that part of the system is free-cooling and part is chiller-cooling. As a result, a data center operated by the techniques discussed here may be substantially less expensive to operate than would other data centers.

In one implementation, a method of providing cooling by a cooling system to a computer data center is disclosed. The method comprises providing a plurality of air-and-water radiators and one or more chillers, the chillers each having a first side in fluid communication with a chilled water loop and a second side in communication with a condenser water loop. The method also comprises circulating a first portion of return water coming from the computer data center to a first subset of the air-and-water radiators and through the condenser water loop, circulating a second portion of the return water from the computer data center to a second subset of the air-and-water radiators and through the chilled water loop, and, circulating the first portion and the second portion of the return water to the computer data center as cooled supply water. The method can also include selectively proportioning return water to each of the first and second subsets of the air-and-water radiators in response to sensing a change in cooling load for the computer data center. The selectively proportioning can comprise increasing a proportion of water to the second subset relative a proportion of water to the first subset when a overall load level on the cooling system increases. The selectively proportioning can also comprise opening one or more additional banks of radiators for the first subset of radiators when the overall load level increases. Also, the air-and-water radiators can comprise hybrid cooling towers.

In some aspect, the air-and-water radiators are arranged grid of x rows and y columns, and each subset of radiators comprises one or more rows of radiators in the grid. Also, the first portion of the return water can be circulated to the second side of the chillers after it is circulated to the first subset of the air-and-water radiators. Moreover, the second portion of the return water can be provided through the chilled water loop to the data center without passing through the chillers. In addition, the second portion of the return water can be blended with water supplied by the chilled water side of the chillers.

In another implementation, a cooling system for a computer data center is provided. The system comprises a chilled water loop that connects loads in the data center with chilled water sides of one or more chillers, a condenser water loop that connects condenser water sides of the one or more chillers with a plurality of air-and-water radiators, one or more fluid conduit that connect the chilled water loop to the condenser water loop, and one or more control valves in the one or more conduits arranged to control relative amounts of warmed return water from the data center to the chilled water loop and the condenser water loop. The system can also comprise a central control system programmed to control the one or more control valves in response to changes in cooling load on the data center. The central control system can be programmed to increase a proportion of the warmed return water that is provided to the chilled water loop relative to a proportion of warmed return water that is provided to the condenser water loop when a cooling load on the data center increases. The central control system can also be programmed to stage operation of the chillers in coordination switching of air-and-water radiators from the chilled water loop to the condenser water loop, in response to changes in cooling load on the data center.

In some aspects, the system further comprises control valves arranged to selectively isolate a first subset of the air-and-water radiators from a second sub-set of the air-and-water radiators, so that the first subset is connected to the chilled water loop and the second subset is connected to the condenser water loop. In addition, the system can include a data center supply header and a data center return header that each include a conduit having a plurality of taps, with a first plurality of taps connected to piping inside the data center, and a second plurality of taps connected to outputs of the one or more chillers. The return header can be connected to inputs of the one or more chillers and inputs of the plurality of air-and-water radiators. Also, the air-and-water radiators can comprise dry cooling towers.

In yet another implementation, a cooling system for a computer data center is disclosed. The system comprises one or more chillers that define chilled water sides and condenser water sides, a warmed water return conduit arranged to carry water from the data center to the cooling system, a plurality of air-and-water radiators arranged to receive the water from the data center and to cool the water from the data center by circulating ambient air around the water from the data center, and means for controlling amounts of the water from the data center that is circulated through the air-and-water radiators and through the chillers. In certain aspects, the water from the data center is circulated through the chilled water sides of the one or more chillers and the condenser water sides of the one or more chillers. Also, the water from the data center can be circulated through the chilled water sides of the one or more chillers only after it is circulated through the air-and-water radiators.

The details of one or more implementations of the data center cooling systems and techniques are set forth in the accompanying drawings and the description below. Other features and advantages of the systems and techniques will be apparent from the description and drawings, and from the claims.

DETAILED DESCRIPTION

In general, various example techniques are described here for constructing and operating data centers in manners that can permit lower power consumption in cooling the data centers. In general, water coming from a data center that has been used to cool the electronic components in the data center (e.g., racks of computers an networking gear) and is thus warmed water, may be sent either to the chilled water side of one or more chillers or to a field of radiators, or a mix of the two. Water from the radiators may be returned directly back to the data center to continue cooling the equipment in the data center, and/or may be routed through the condenser sides of the chillers.

The proportion of warmed water that is cooled by the chillers, which is relatively expensive, versus that cooled by the radiators, which is relatively cheap, may be determined by the cooling loads on the system, and effected by control valves that are appropriately placed in the water circulation loops. On cool days, all of the water may be adequately cooled by the radiators so the circulation loop may go from the data center to the radiators and back, without any involvement of the chillers. On warmer days, a subset of the chillers may be operated, and a corresponding proportion of the radiators may be used to circulate condenser water in a condenser water loop to the chillers. The remainder of the radiators may be used to circulate water directly back to the data center (where it can be mixed with water supplied by the chilled water sides of the chillers, to maintained a desired supply water temperature).

Various such arrangements may not be the most efficient under any particular weather conditions. For example, it may be most efficient in high dry-bulb temperatures to employ chillers with refrigerants that are circulated into a field of coils. However, the techniques herein may provide for more cost-effective cooling when cooling costs are considered over a variety of conditions, such as over the course of a year for a data center that is operated in a relatively temperate climate (e.g., one where the temperature is high at times and substantially cooler at other times, either at different times of the day or in different seasons).

Figure 1A:
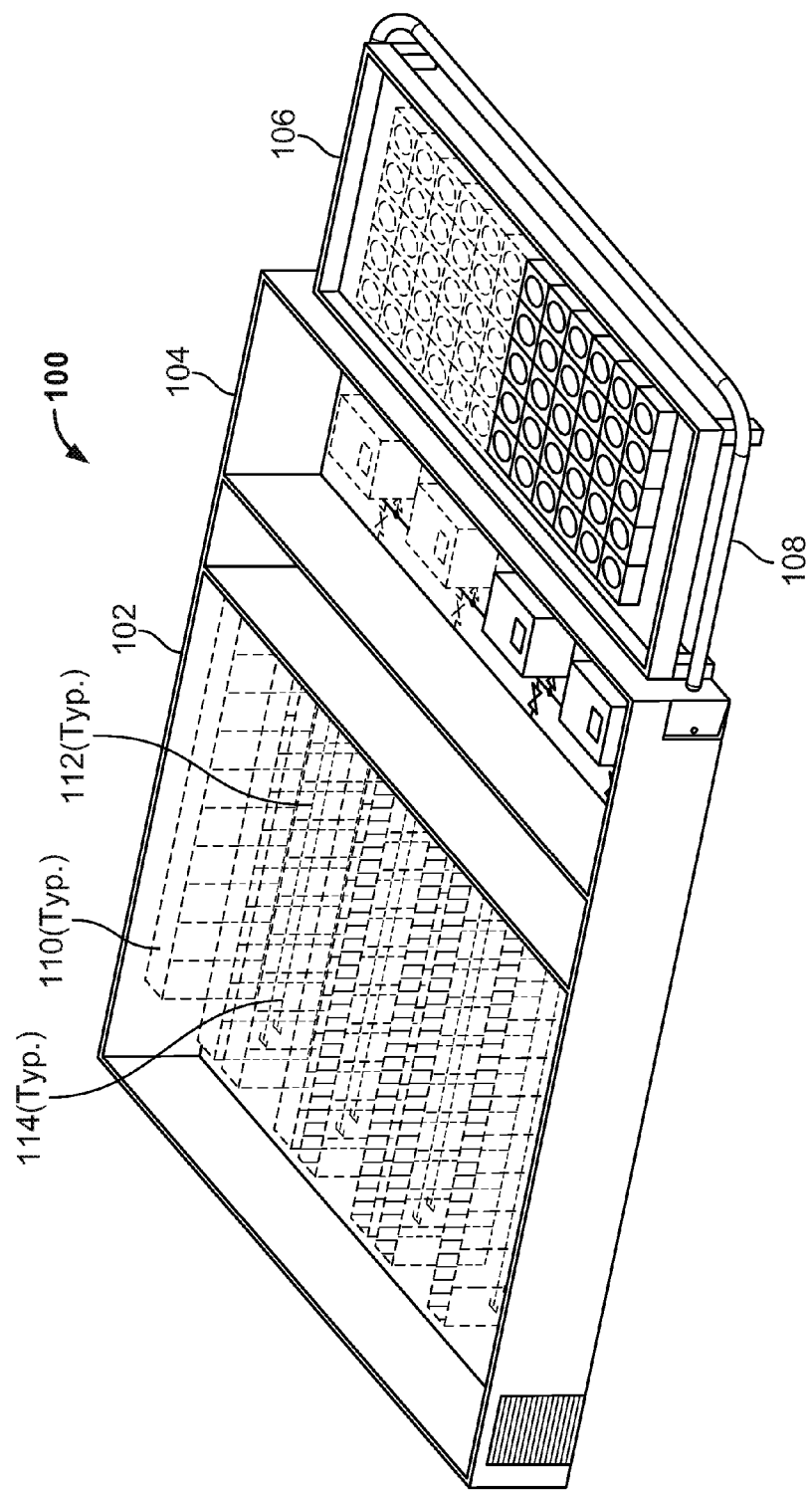
FIG. 1A is a perspective view of a data center and associated cooling plant.

FIG. 1A is a perspective view of a data center 102 and associated cooling plant. The data center 102 and cooling plant are part of a larger data center site 100 that includes the data center 102 and the ancillary systems and service needed to operate the data center 102. The figures here focus on ancillary cooling services and systems, though a skilled artisan would understand that electrical systems would also be integrated with the features disclosed here, both to power the electronic equipment in the data center 102 itself, and equipment in the cooling plant (e.g., pumps, chillers, fans, automatic valves, etc.).

One goal in the operation of a data center such as data center 102 is to minimize the amount of electricity consumed by the data center 102. One large portion of that electricity goes into operating the electrical equipment inside the data center 102, electricity that ultimately turns into heat. Somewhat ironically, another large portion of the electrical usage of a data center 102 goes into removing that heat created by the original electrical consumption. This secondary electrical consumption can be massive, so that increases in the efficiency of the cooling systems for the data center can being large monetary savings.

Referring again to FIG. 1, the data center 102 houses one or more rows of computer racks 110, which each can hold a large plurality of computers (e.g., dozens or more on an equal or smaller number of motherboards). The rack 110 is shown dashed here to indicate that it is inside the enclosed data center 102. The computer in the racks 110 may be implemented on motherboards that can be mounted, for example, horizontally on shelves or vertically, with front or back edges that may include connections for network and for electrical power.

Air circulation apparatuses such as fans may be positioned near the computers. The air may also be circulated through cooling coils, either adjacent to the computers and distributed throughout the data center 102, or in more central locations (e.g., by exhausting heated air into a warm-air capture plenum that has cooling coils along one or more of its peripheral edges, and that returns cooled air to the data center 102 workspace so that it can be circulated over the computers and other electronic equipment again.

The motherboard may also be equipped with liquid cooling apparatuses. For example, to provide for targeted cooling where high-levels of heat transfer are needed, the motherboards may be mounted face-to-face with a highly heat conductive block between them, and components that generate high levels of heat in physical contact with the block. Cool water may then be circulated through the block so as to provide highly effective conductive heat transfer from those components. Lower heat components such as memory chips (e.g., DRAM and Flash memory, included solid state drives (SSDs) may be mounted on the back sides of the motherboards, away from the block, and may be cooled by circulating air (e.g., convection).

Cooling water supply conduit 114 and cooling water return conduit 112 are typical of piping that may be used to bring cooling water to the cooling coils and remove it back out to the cooling plant. For example, such conduits 112, 114 may be provided for each row of computer racks 110 or each group of n rows of computer racks. The particular layout of racks and cooling water circulation conduits may vary, depending on the particular needs of the data center 102, the costs of constructing and operating the data center 102 and the relative importance of constructing the data center 102 versus the costs of operating the data center 102.

The cooling plant in this example is made up of a chiller house 104 and a radiator field 106. The cooling water conduits 112, 114 may lead to the chiller house 104, which may be connected to or otherwise adjacent to the data center 102 (e.g., to reduce piping costs and heat transfer into the pipes). Various chillers (one of which is shown in dashed outline) may be installed in the chiller house 104, and may supply chilled water (whose actual temperature may depend on the particular needs of the data center 102) to the water supply conduit 114. The chillers may also obtain warmed water form the data center, such as from the water return conduit 112. Such circulating loop is relatively typical for various types of cooling systems.

The chillers in the chiller house 104 may, as chiller typically do, have condenser water sides in addition to their chilled water sides. The chillers, in general operation, use electricity (e.g., in reciprocating, screw, or centrifugal chillers) or another energy source (e.g., natural gas) to transfer heat from their chilled water side to their condenser water side, so as to transfer heat away from the data center 102. Thus, the chilled water leaves the chillers at a substantially lower temperature than it enters, and the condenser water leaves the chillers at a substantially higher temperature than it enters.

The heated condenser water is then cooled in the radiator field 106 upon being delivered to the condenser water loop by the condenser side of the chillers. The radiator field 106 is made up of a plurality of radiators (e.g., fan-coil units) that may each include a radial fan blowing over a grid of fins that have closed tubes running through them in a traditional radiator arrangement. The air at outdoor ambient conditions may substantially cool the condenser water as it passes through the radiator field 106, before it is returned to the chillers.

Thus, in one mode of the system, the chilled water can be circulated between the chilled water side of the chillers and the data center 102, and the condenser water can be circulated between the condenser water side of the chillers and the radiator field 106. Such a mode would involve relatively high energy consumption because the chillers require relatively high levels of energy to operate, but it would also provide high levels of cooling.

A bypass conduit 108 is shown extending from the chiller house 104, however, and may be used to provide warmed return water from the data center 102 to the radiator field 106 without that water being circulated through the chillers in the chiller house 104. Thus, for example, return water flow from the data center 102 to the chillers may be shunted entirely to the radiator field 106 and then returned to the data center 102 without passing it through the chillers. Although such a circulation mode will not generally remove as much heat from the water as would passing it through the chillers, it may remove enough heat when the outdoor dry bulb temperature is moderate, and it can do so with much lower electrical usage. Such a mode may be considered a free-cooling mode of operation. The two modes may also be blended in differing proportions, as explained in more detail in the following figures.

Figure 1B:
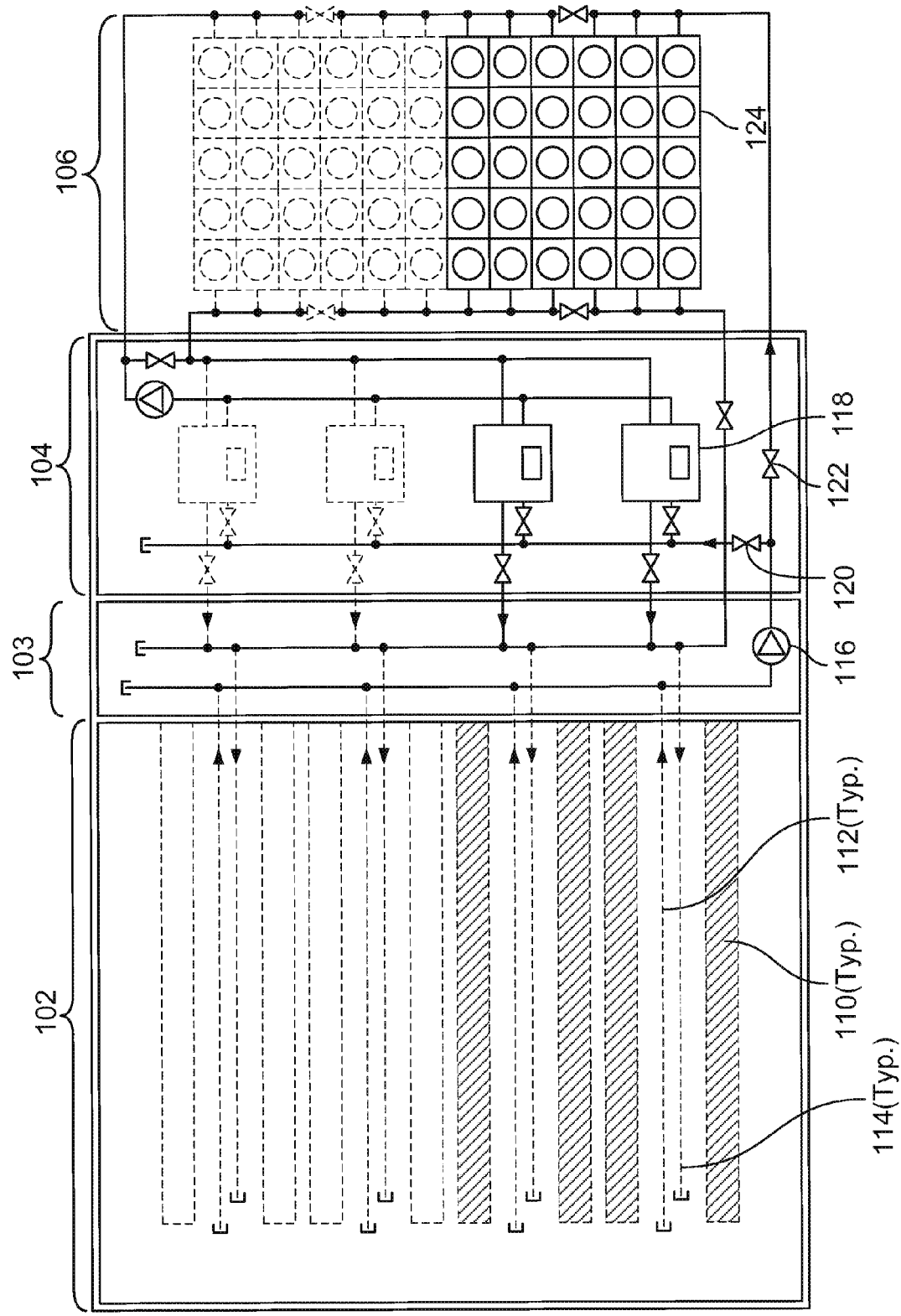
FIG. 1B is a plan view of the a data center similar to the data center in FIG. 1A.

FIG. 1B is a plan view of the a data center similar to the data center in FIG. 1A. This figure again shows the data center 102 on the left, with three example rows or server racks 112, and two pairs of supply 114 and return 112 water conduits inside the data center 102. To the right of the data center 102 is a chiller house 104, and in this example, a mezzanine 103 connects the data center 102 to the chiller house 104. The mezzanine houses a supply water header and a return water header for the data center 102. The headers may each have a number of taps that lead to respective supply and return conduits both to the data center 102 and to chillers 118 inside the chiller house 104. Each of the taps may include a shut-off valve (not shown) so that the respective conduits corresponding to the taps may be isolated from the rest of the system.

The use of such shut-off valves and headers may enable more flexible construction, repair, and upgrading of the data center 102. For example, when the data center is constructed, the header may first be installed, with all of the relevant taps attached to the headers and stubbed out. As chillers and rows of servers are installed, their associated conduits may be connected to the stubs, and the shut-off valves may then be opened when the new racks or chillers are commissioned. In this manner, a portion of the data center 102 may be brought on-line quickly, and may continue to operate without operation as other portions of the data center 102 are installed and brought on line. Likewise, if a portion of the data center 102 or a chiller 118 needs to be repaired, replaced, or upgraded, its associated shut-off isolation valves may be closed, and the changes may occur without substantially affecting the rest of the system.

The use of such headers may also increase the flexibility of operating the system. In particular, all of the chillers 118 may together supply all of the rows of racks 110 in the data center 102 together through the headers. Thus, if one chiller fails and the system is designed to have n+1 chillers available, the remaining chillers can pick up the demand, and the chilled water may be distributed evenly to the racks. Even if the chillers cannot meet the full demand, the chilled water may be delivered at a higher-than-design temperature evenly to all of the racks. Also, if some racks need to be shut down, the operator of the data center 102 may have flexibility in selecting which racks to shut down since each set of racks is not uniquely correlated to particular chiller.

A pump 116 circulates warmed return water from the data center 102 to the cooling plant, and such water is diverted by a pair of control valves 120 and 122. These valves, along with others, may be cooperatively controlled by a central control system to allocate proportional amounts of the warmed return water either to the radiator field 106 or the chillers 118. For example, when less cooling is required, more water may be directed to the radiator field 106, and when more cooling is required, more water may be directed toward the chillers 118 (and less to the radiator field 106).

Such proportional diversion of water may also be controlled to occur in stages levels, so that groups of radiators 124 are added to the water loop coming from the data center 102, and are taken off the condenser loop from the chillers 118 (e.g., as cooling loads fall). For example, the field 106 has six columns of radiators that each have five radiators in rows. Control valves are located in the headers that serve the radiator field 106 so that groups of three columns may be switched between the two loops at a time. The groups of three columns may each correspond to condenser water cooling that is needed for one chiller 118. Thus, as a group of three columns of radiators 124 is brought over to the condenser loop, a corresponding chiller may be activated. Conversely, as ambient temperatures or other cooling loads drop (e.g., as activity of the computers in the data center 102 drops), chillers may be shot down, and the valve may be opened so that both sets of columns received warmed return water via valve 122. A dashed line is shown in the field 106 to indicate that two more sets of columns could be added to the field 106, corresponding to the two additional chillers that could be added to the chiller house 104, and additional rows of racks (not shown) that can be added to the data center 102.

The fan field may be calibrated by the central control system so that a most-economical mode is employed by the system. For example, look-up tables, functions identified by empirical research, and learning systems that are trained on past data may be used to identify a most-appropriate number of radiators that should be placed in each part of the system (e.g., interacting directly with the data center versus providing support to the chillers 118) for particular conditions.

The central control system may take into account various variables in determining the proportion of water to be routed through the field 106 versus the amount to be routed through the chillers 118. For example, dry bulb temperature may be a main determining factor, and projected ambient temperatures (from weather reports) may be used to ensure that the system is properly configured when the temperatures change. Likewise a control system for allocating computing tasks to the data center 102 may be in communication with the central control system, as the level computing activity may have a substantial effect on the cooling loads in the data center 102. Thus, the central control system may be provided with predictive models for cooling loads that take into account both outdoor ambient conditions in the future and future data center computing loads in order to determine a most economical operating mode for the data center 102.

Figure 2:
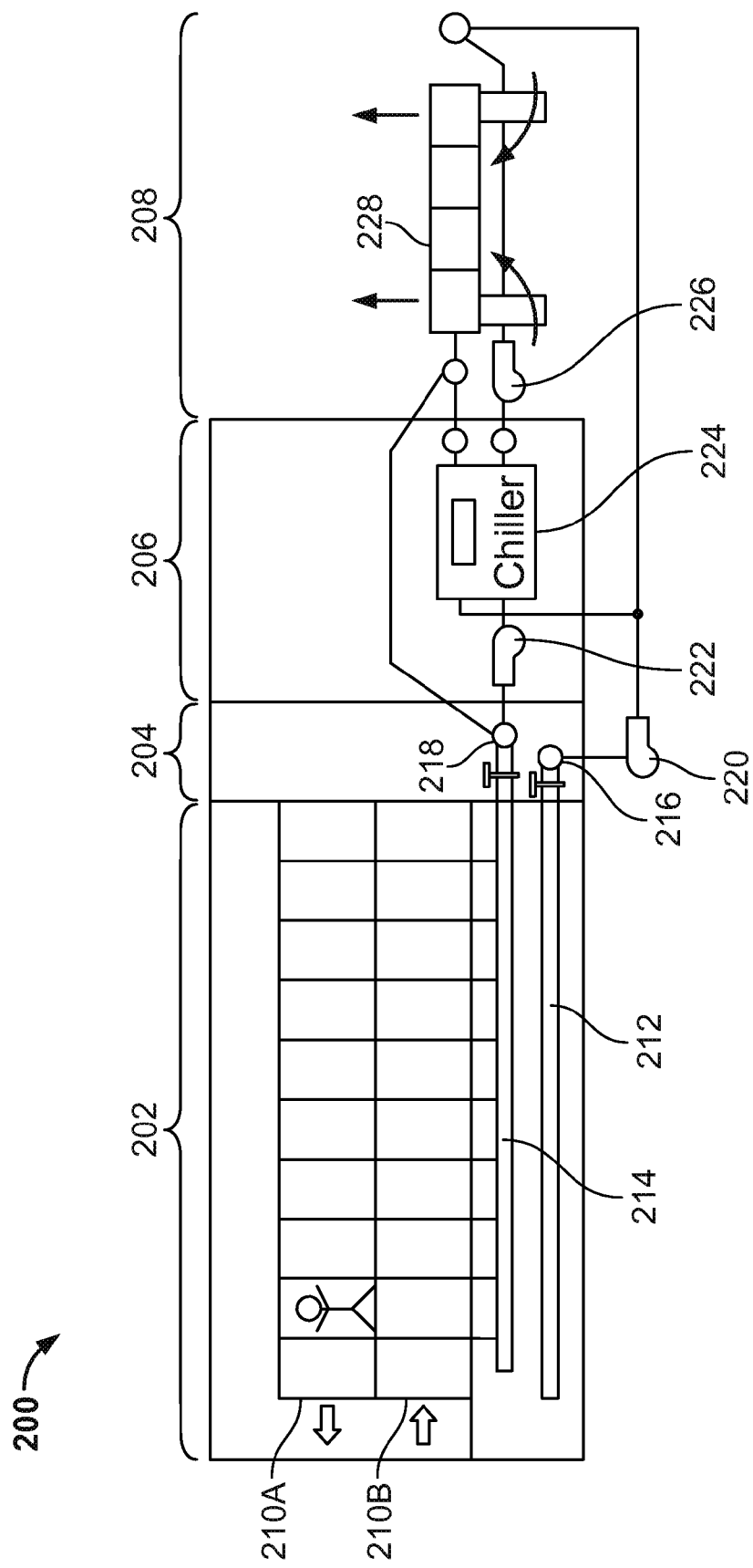
FIG. 2 is a sectional view of a data center similar to the data centers in FIGS. 1A and 1B.

FIG. 2 is a sectional view of a data center similar to the data centers in FIGS. 1A and 1B. In this example, the data center 102 includes two tiers of computer server racks 210A and 210B. Such vertical tiering of racks may increase the heat generating density of the data center 102, and may provide for improvements in various computing and cooling techniques. In this example, the total "stack" height of the computing racks is approximate 14 feet. A walkway is provided in this example so that workers can access all of the computers. Also, air is circulated horizontally behind the racks and into a workspace at one end of the racks, though open areas could be provided at both ends of the racks for air circulation. The ends may be covered in one or more cooling coils so that air captured behind the racks may be cooled before it is release back into the workspace.

An elevated floor is shown under the racks 210A and 210B, and supply 214 and return 212 conduits are located under the floor in a conventional manner. The conduits may be connected fluidly (not shown) to the cooling coils inside the data center 102 by taps along the length of the conduits 212, 214. Alternatively, coils could be provided at one end of the data center, and the conduits 212, 214 could be contained only in the mezzanine section 204.

Supply 216 and return 218 headers are shown in the mezzanine section 204 to connected to the conduits 212, 214. Shut off valves are shown on the conduits 212, 214 so that the conduits 212, 214 may be isolated fluidly from the rest of the system. Chilled water can be provided to the supply header 218 from pump 222 which draw from one or more chillers 224. Return water that is warmed in the data center may be circulated by a pump 220 which may deliver the water either to the chillers 224 or a radiator field 228, or a blended combination of the two. Another conduit leads from the radiator field 228 back to the supply conduit 218 so that the radiator field 228 can serve the data center 202 directly, without the chillers 224 or in combination with the chillers 224.

A pump 226 is operated to control water in a condenser loop on the condenser side of the chillers, which can be circulated through the radiators in the radiator field that are not serving the data center 202 directly. Also, the condenser water from the chillers 224 and the warmed water from the data center 202 (via pump 220) may be blended in appropriate instances before being provided to the radiator field (e.g., by providing both to a header that is in turn connected to the radiator field).

Particular valving is not shown in the figure, though the valving arrangements of the figures above and below may be employed, as appropriate. In particular, the valving may be arranged in the fluid circulation loops so that different levels of water may be diverted to the chiller part of the system and the radiator-only part of the system, as the needs of the data center dictate. In this manner, the system may provide for various modes of cooling that are each directed at different load levels for the data center 202 and ambient outdoor conditions.

Figure 3:
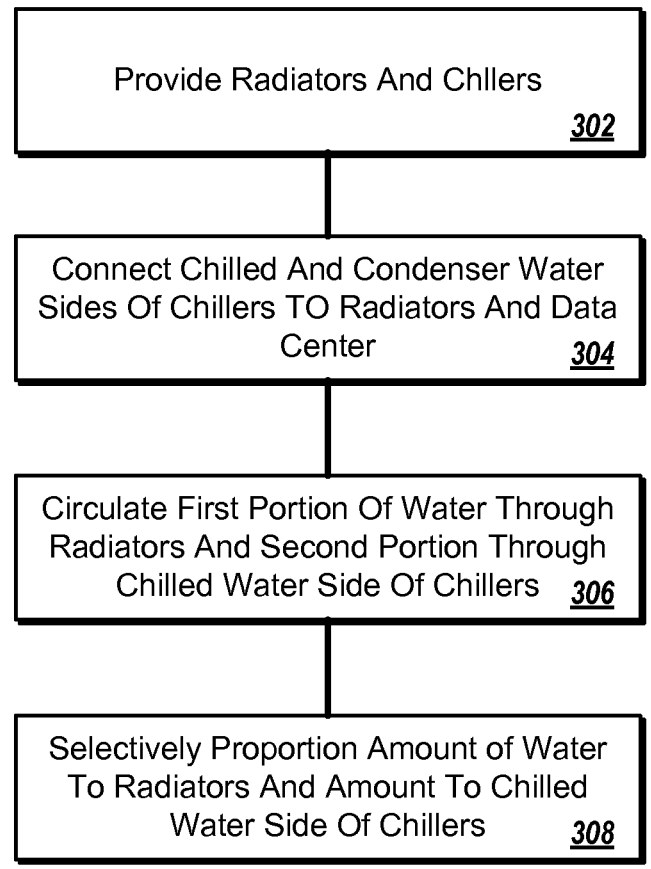
FIG. 3 is a flowchart showing a process for providing cooling to a data center.

FIG. 3 is a flowchart showing a process for providing cooling to a data center. In general, the process involves providing radiators and chillers connected by water circulation loops and segmented by automatic valves so that different amounts of water may be provided to the radiators as direct coolers for the data center versus indirect coolers (in support of the chillers by cooling condenser water for the chillers).

The process begins at box 302, where radiators and chillers are provided with a data center in a configuration that provides for controllable and selective circulation of water in a chilled water loop (i.e., a loop that traditionally servers the cooled space and circulates to the chilled water side of the chillers) versus water in a condenser water loop (i.e., a loop that traditionally circulates to the condenser water side of the chillers and to condenser water coolers such as cooling towers or fan-coil radiator units).

At box 304, the chilled and condenser water sides of the chillers are connected to the radiators and the data center. For example, the chilled water side may be connected exclusively to the data center, and the condenser water side may be connected exclusively to the radiators. Such a connection scheme is a typical connection for cooling with a bank of chillers, particularly when loads on a system are high (e.g., the computers in a data center are very active and the ambient conditions are warm).

At box 306, a first portion of water is circulated through the radiators and a second portion is circulated though the chilled water side of the chillers. In this mode, the two circulations are kept separate from each other. However, if the load on the system drops, the process may move to box 308, where the process selectively proportions an amount of return water from the data center to the radiators and an amount to the chillers. Thus, less of the return water is now being sent to the chillers, so that less water from the condenser side of the chillers needs to be sent to the radiators. For example, one of the chillers may be shut down and isolated from the system. The extra capacity in the radiators that is made available by this action may be picked up by circulating a portion of the warmed return water directly to the radiators, and then returning water supplied to by the radiators to the data center. Other water supplied to the data center may still be supplied by the still-operating chillers.

If the load continues to drop, this process may continue, with additional chillers dropping out and additional subsets of the radiator serving the data center directly. Eventually, all of the chillers may drop out, and there may simply be a single loop from the data center to the radiators and back. Thus, the process shown here may be continuous and iterative, so that the routing of water in the system may change with the condition of the system, and even with a predicted condition of the system.

Figure 4A:
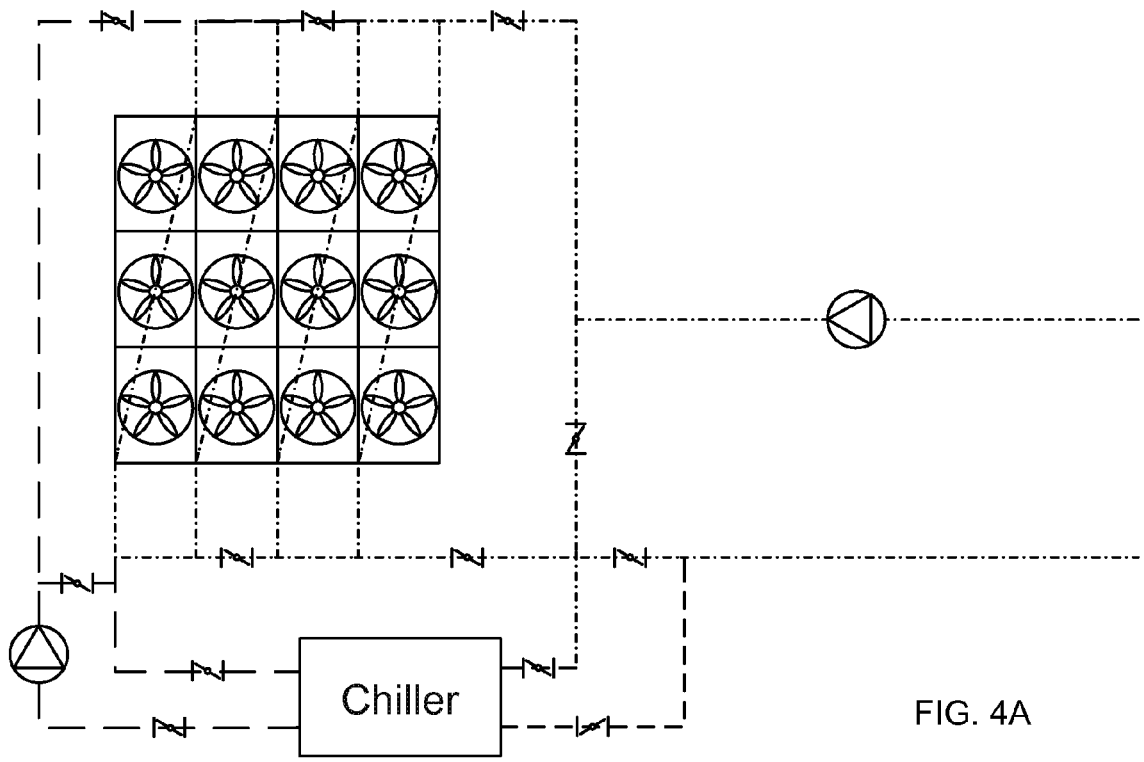
FIG. 4A is a schematic diagram of a single-plant air-and-water cooling system.

FIG. 4A is a schematic diagram of a single-plant air-and-water cooling system. This system is arranged generally like the systems above, but shows in more detail an example valving arrangement for allocating water flow through the circulation loops of the system. In this example, a return water pump provide water coming form the data center (off the figure to the right), and control valves control how much of that water is provided to a chiller versus how much is provided to a field of radiators. Another pump on the condenser side of the chiller provides condenser, rather than warmed chilled water, to the radiators. Other valves control which of the radiators in the bank of radiators receive water from which loop.

Figure 4B:
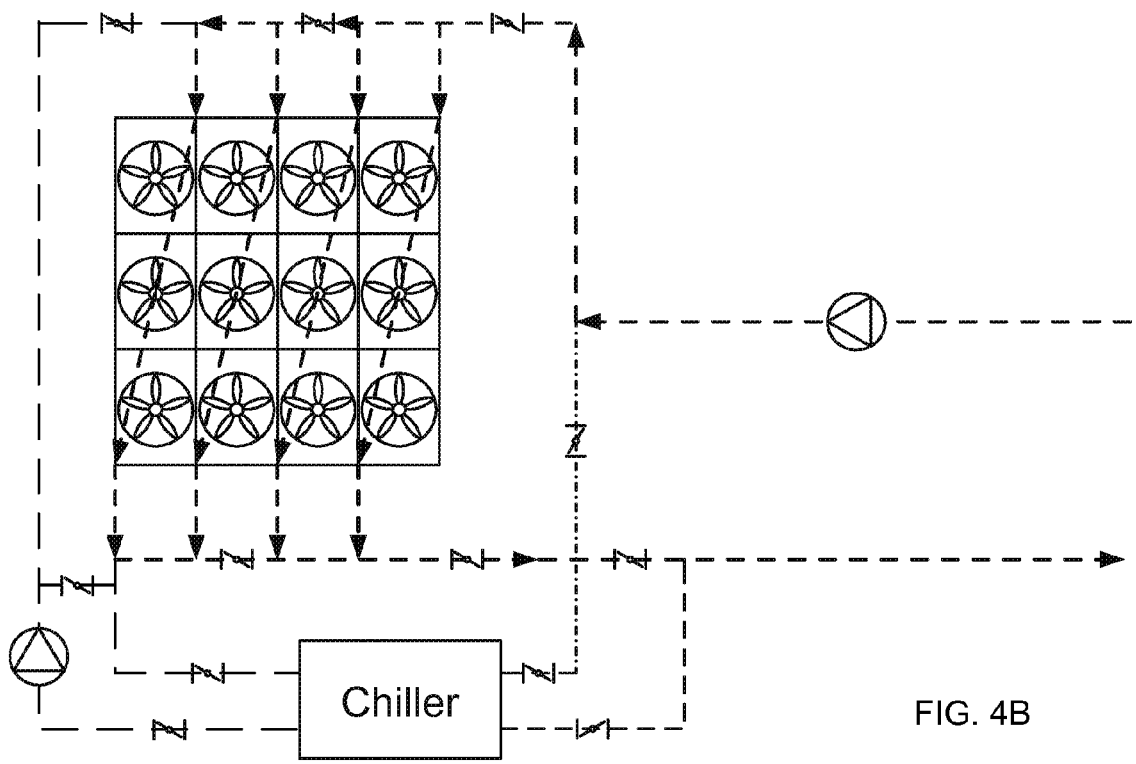
FIG. 4B is a schematic diagram of the system of FIG. 4A in a free-cooling mode.

FIG. 4B is a schematic diagram of the system of FIG. 4A in a free-cooling mode. In this mode, the valves have been controlled so that the conduit from the condenser loop pump is shut, and the radiators receive only water directly from the data center. In this made, the chiller may also be shut down.

Figure 4C:
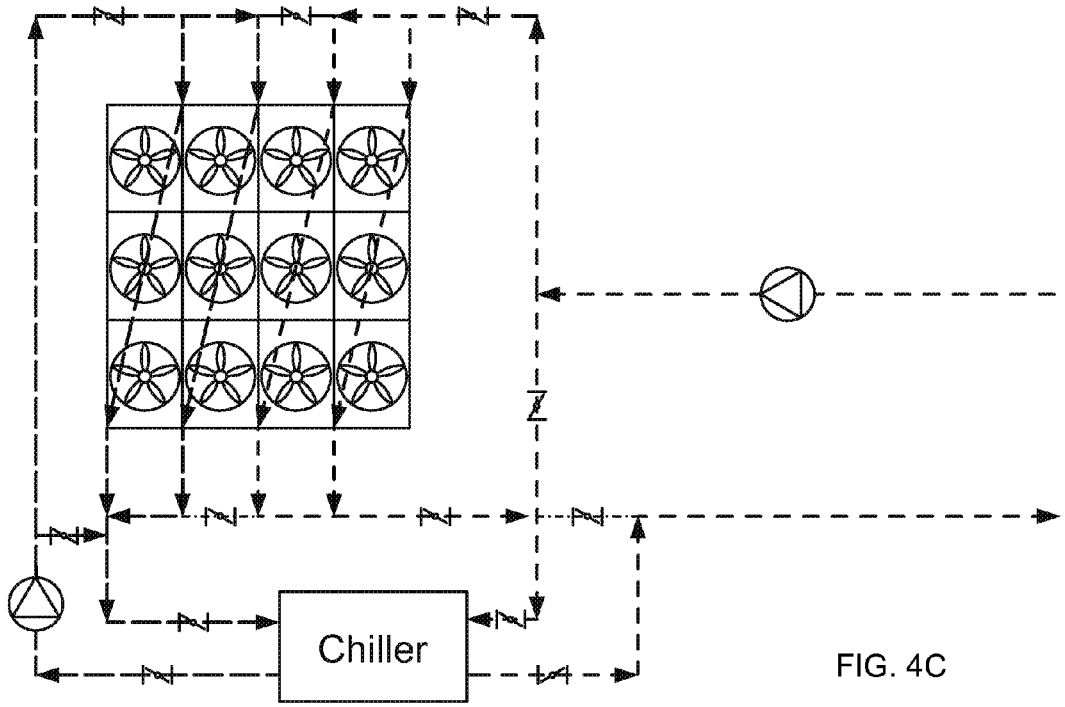
FIG. 4C is a schematic diagram of the system of FIG. 4A in a partial free-cooling mode.

FIG. 4C is a schematic diagram of the system of FIG. 4A in a partial free-cooling mode. In this mode, both pumps are operating, and the middle valves on the supply and return sides of the radiators have been shut. Thus, the bank of radiators is split into two halves, with the right half serving the data center directly, and the left half serving the condenser loop and the condenser side of the chiller. In this mode, the chiller may be operating at a relatively low level.

Also, although the upstream side of the radiators is isolated into two parts, the water entering the radiators form the two sides may be mixed, such as by providing a head long the inputs to the radiators, and supplying water to the header from two close location or form a common conduit. Such an approach may better even the load provided to each of the radiators, and may be preferable in certain situations. Various arrangements may also be used so as to permit segmentation or sharing of the input side of the radiators, depending on the mode in which an operator wishes to operate a system.

Figure 4D:
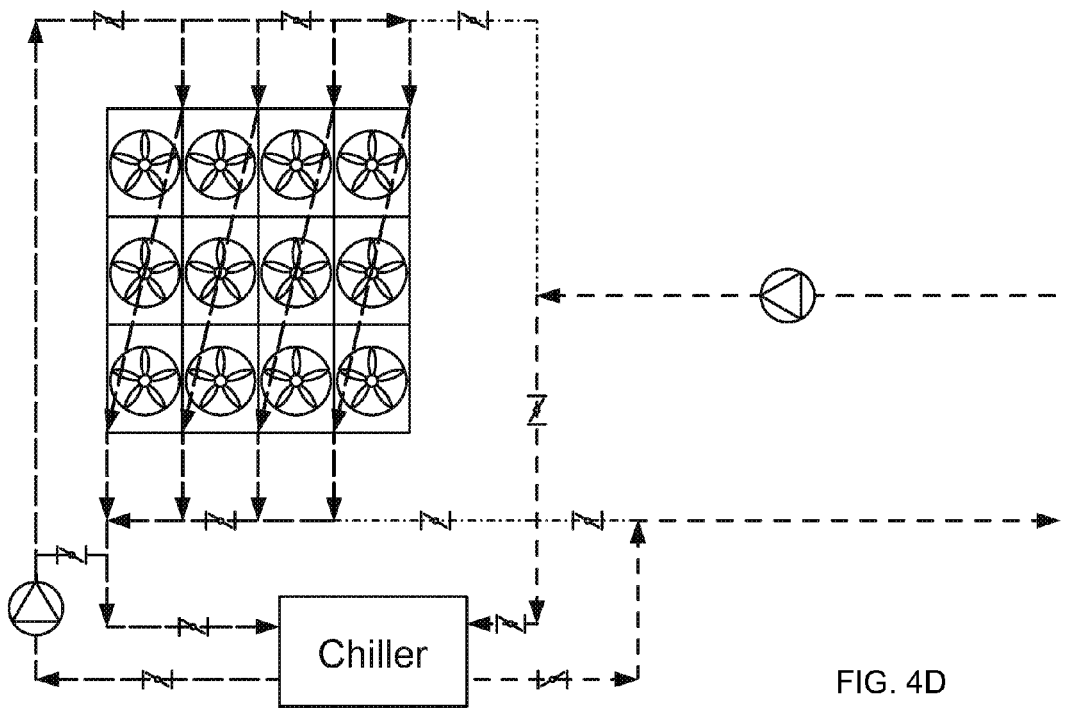
FIG. 4D is a schematic diagram of the system of FIG. 4A in a chiller cooling mode.

FIG. 4D is a schematic diagram of the system of FIG. 4A in a chiller cooling mode. Here, all of the operation of the radiators has been turned over to the condenser water loop for the benefit of the chiller. This may be a mode of operation for maximum conditions (high loads in the data center and high outdoor temperatures), and maximum energy usage. Also in this mode, the pump from the data center is merely serving the chilled water side of the chiller, as the valve between the pump and the radiator field has been closed by a central control system that operates all of the valves, the chiller, and the pumps using well-known control techniques in addition to those discussed here.

FIGS. 5A to 5F are schematic diagrams of a multi-plant air-and-water cooling system in various cooling modes. This system is similar to the system in FIG. 4A, but is much larger, involving multiple banks of radiators and multiple chillers. Each bank of radiators may be similarly sized to the other banks, and may be composed of one or more rows or columns of radiators in the field. Each bank may correspond to one of the chillers, so that when that chiller is operating, the water is routed so that the corresponding bank is supplying cooling to the condenser loop for that chiller. The pumps here are similar to and located in similar positions to those in FIG. 4A, though they would be expected to be substantially larger.

Figure 5A:
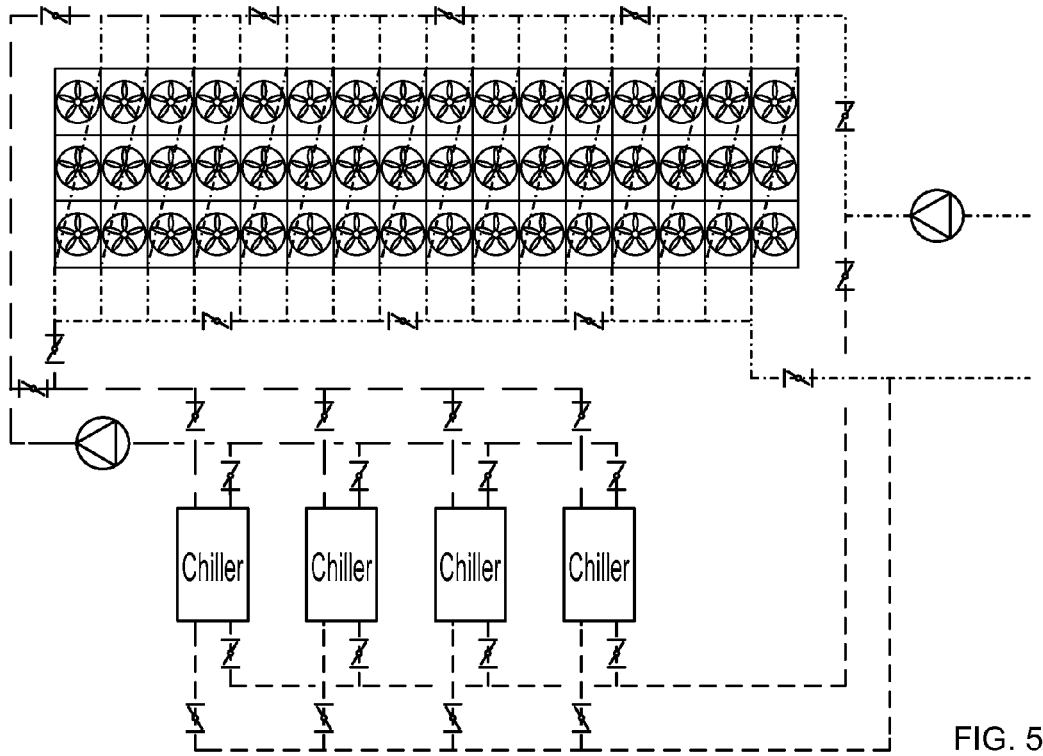
FIGS. 5A to 5F are schematic diagrams of a multi-plant air-and-water cooling system in various cooling modes.
Figure 5B:
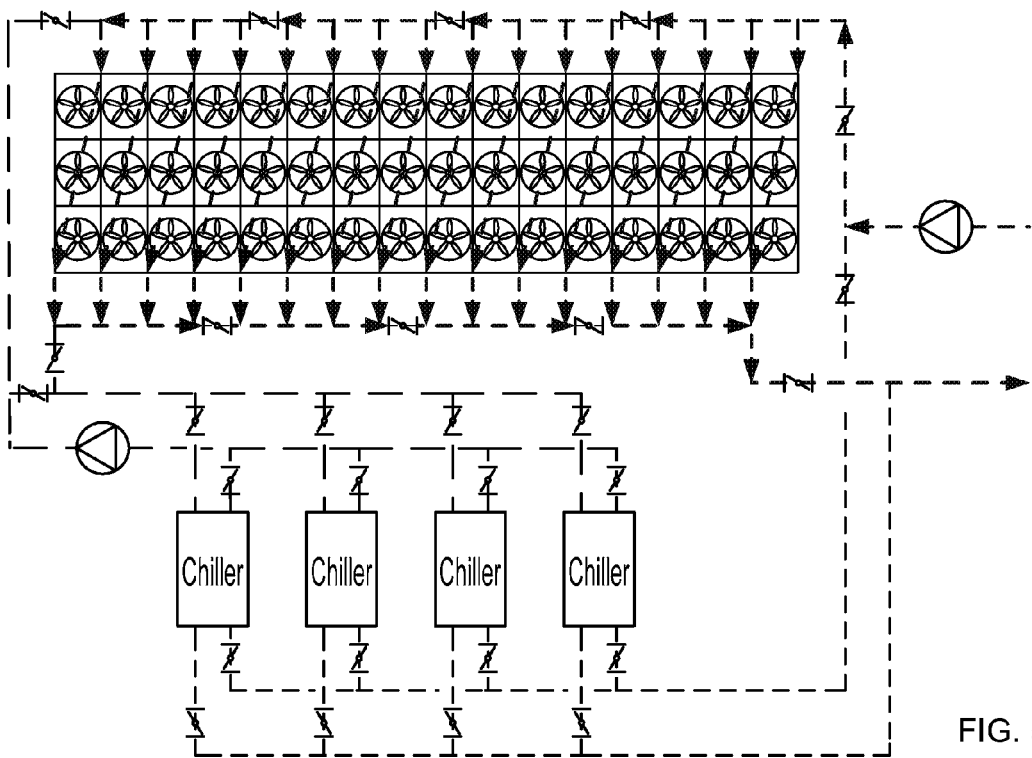

In FIG. 5B, all of the warmed return water form the data center (again, located off the figure to the right) is passed through the radiator field and then returned directly to the data center. Such a free-cooling mode may be very energy-efficient and used when ambient conditions allow it.

Figure 5C:
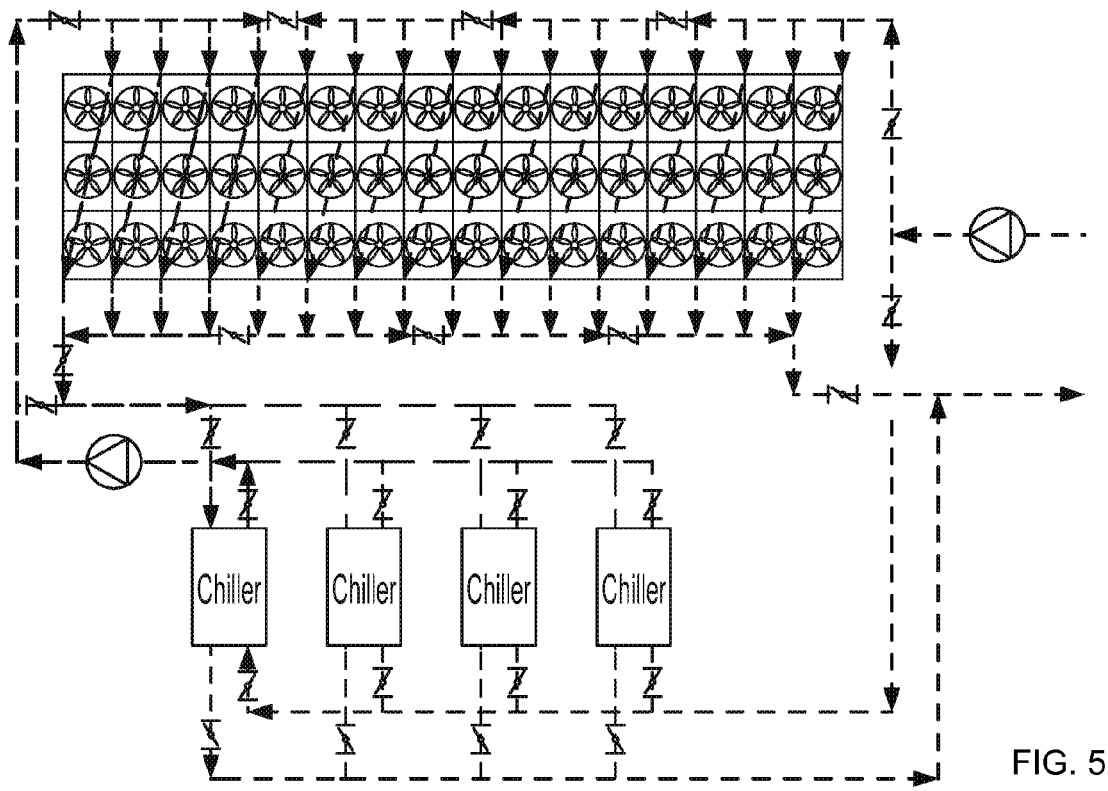

In FIG. 5C, the load on the data center has increased and ambient conditions may have worsened, so that a portion of the radiators are now providing cooled condenser water to one of the chillers. The corresponding control valves may be opened or closed, as would be readily understood, to provide for such routing of the water.

Figure 5D:
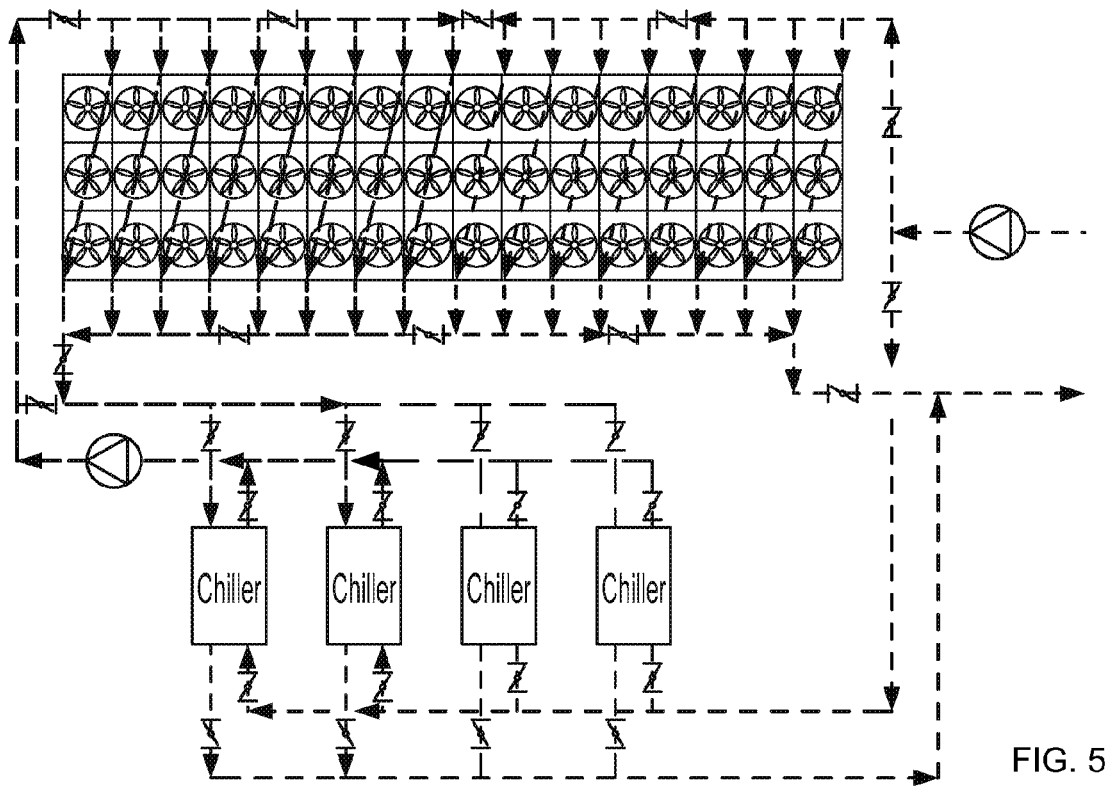

In FIG. 5D, a second chiller has been brought on-line, making one-half of the available chillers active. As a result, one-half of the radiator field has been given over to serving the condenser water sides of the chillers and one-half to serving the data center directly.

Figure 5E:
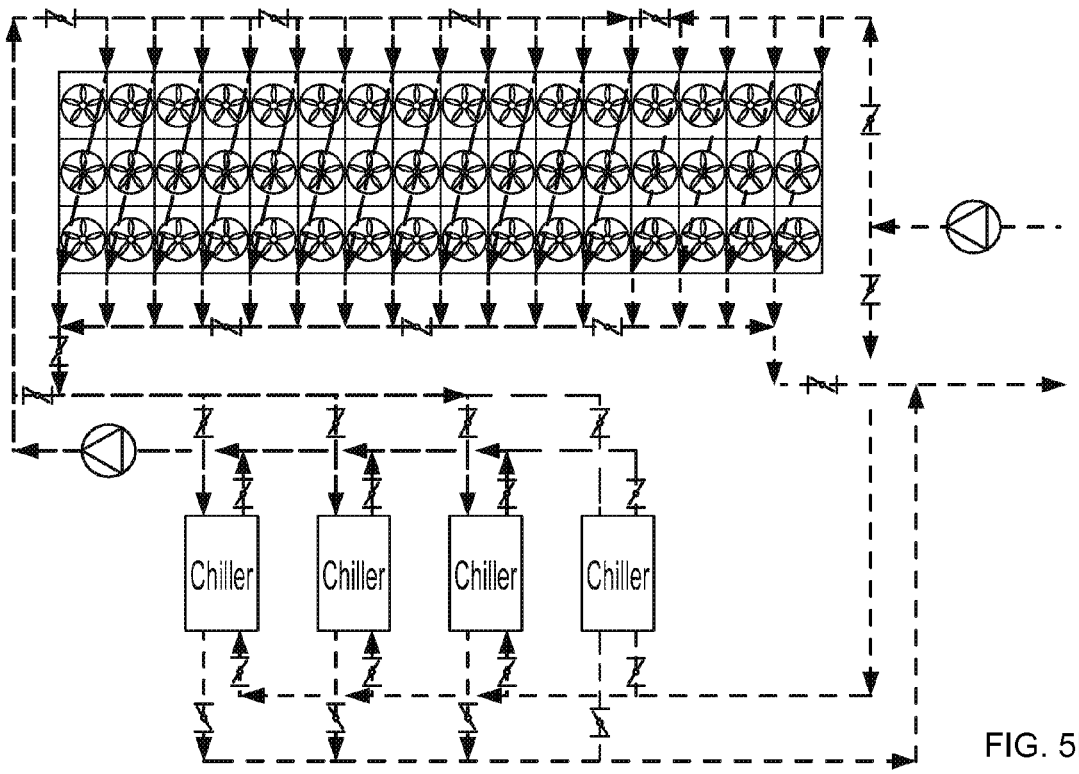
Figure 5F:
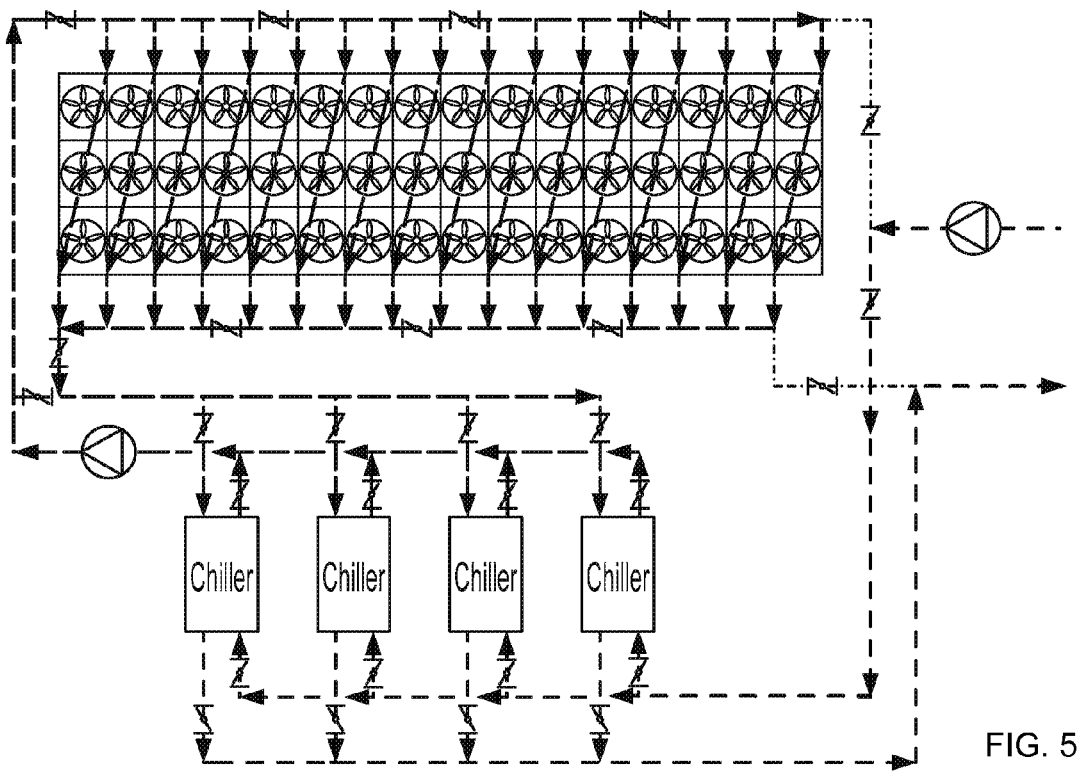
Figure 6A:
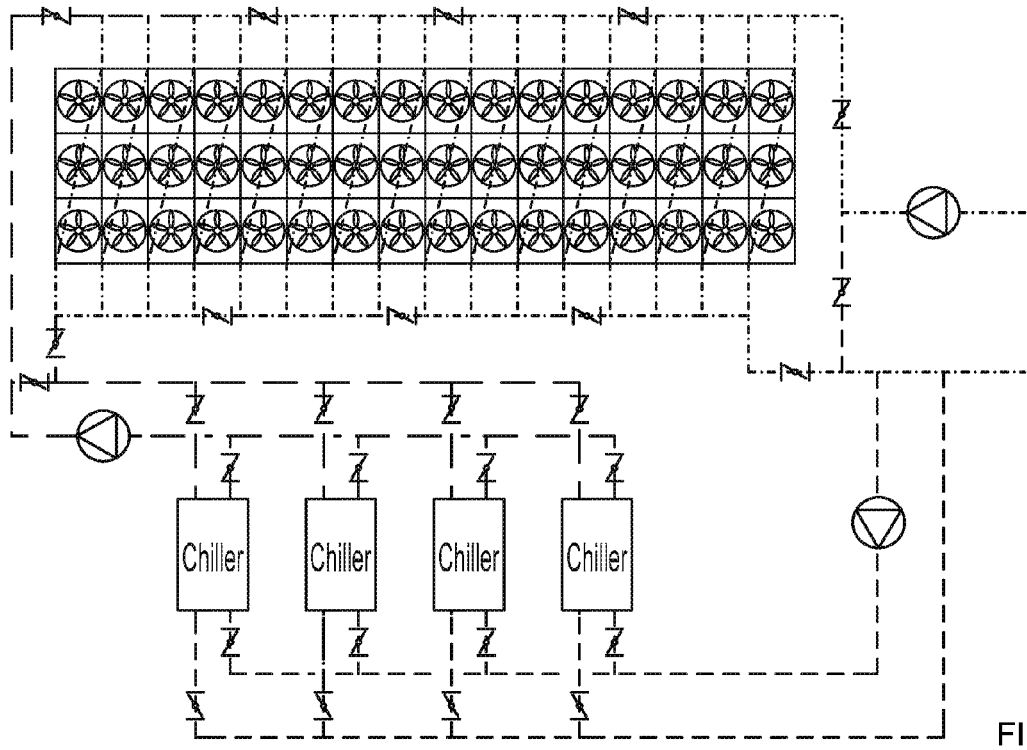
FIGS. 6A to 6F are schematic diagrams of a multi-plant air-and-water cooling system that has secondary chiller piping, in various cooling mode.
Figure 6B:
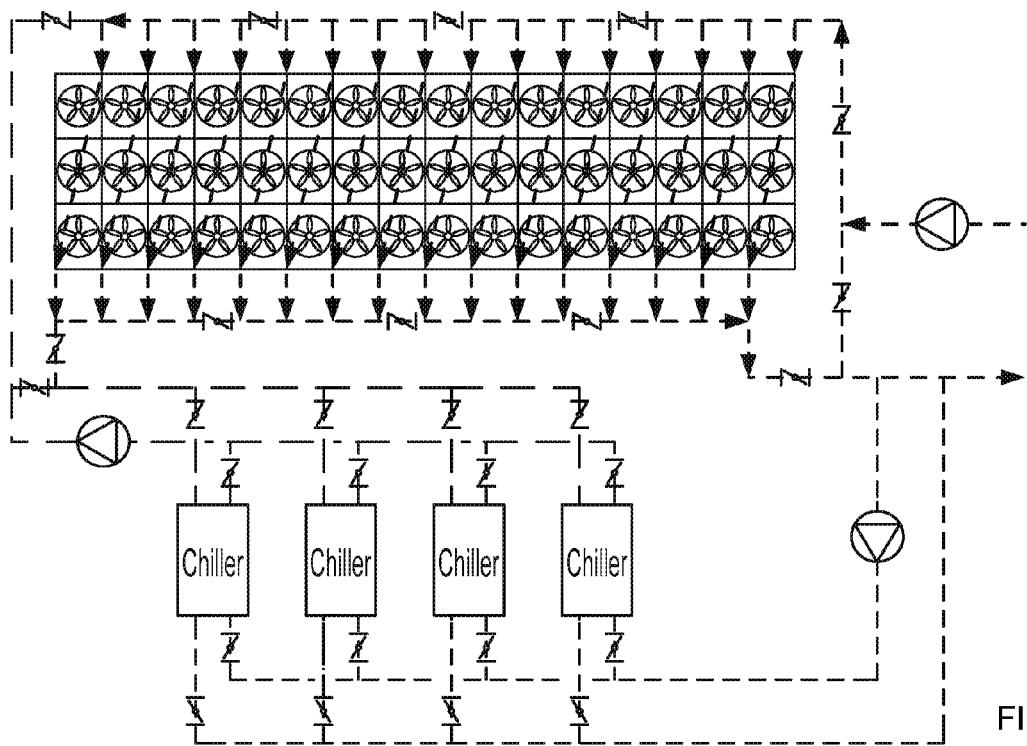
Figure 6C:
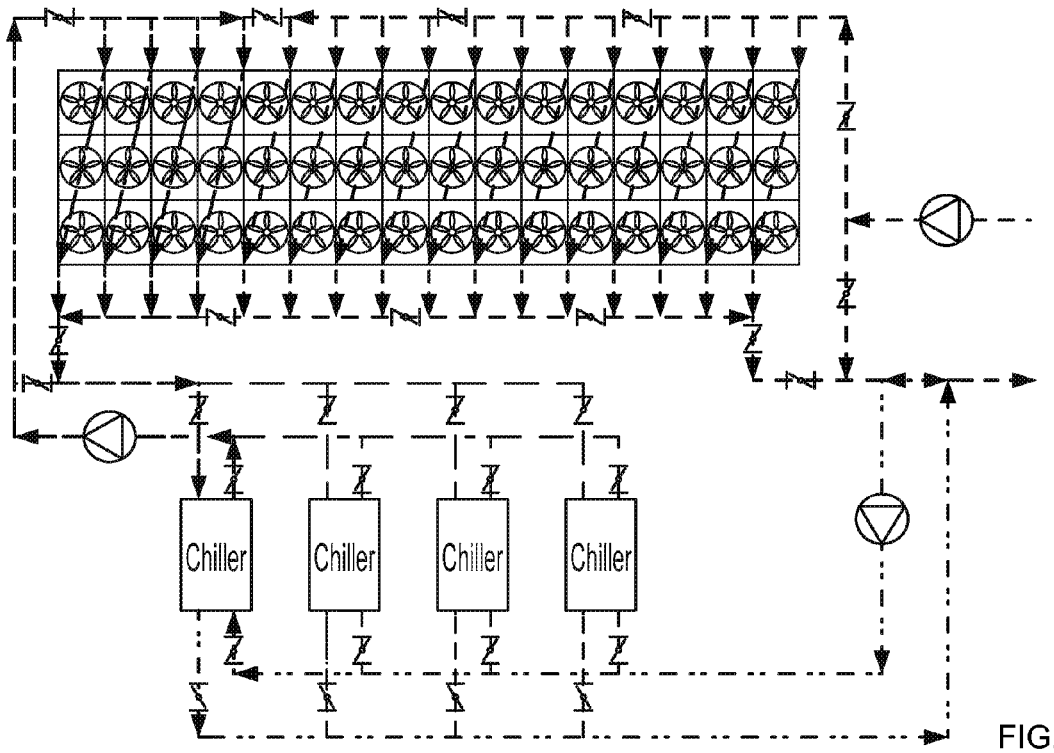
Figure 6D:
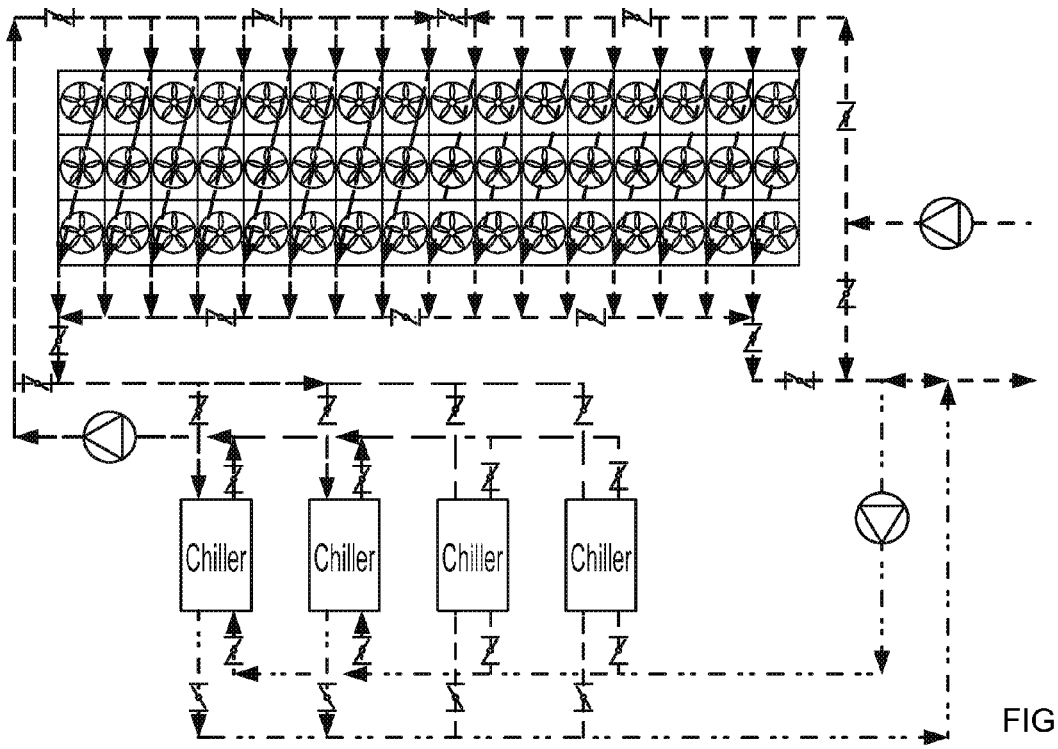
Figure 6E:
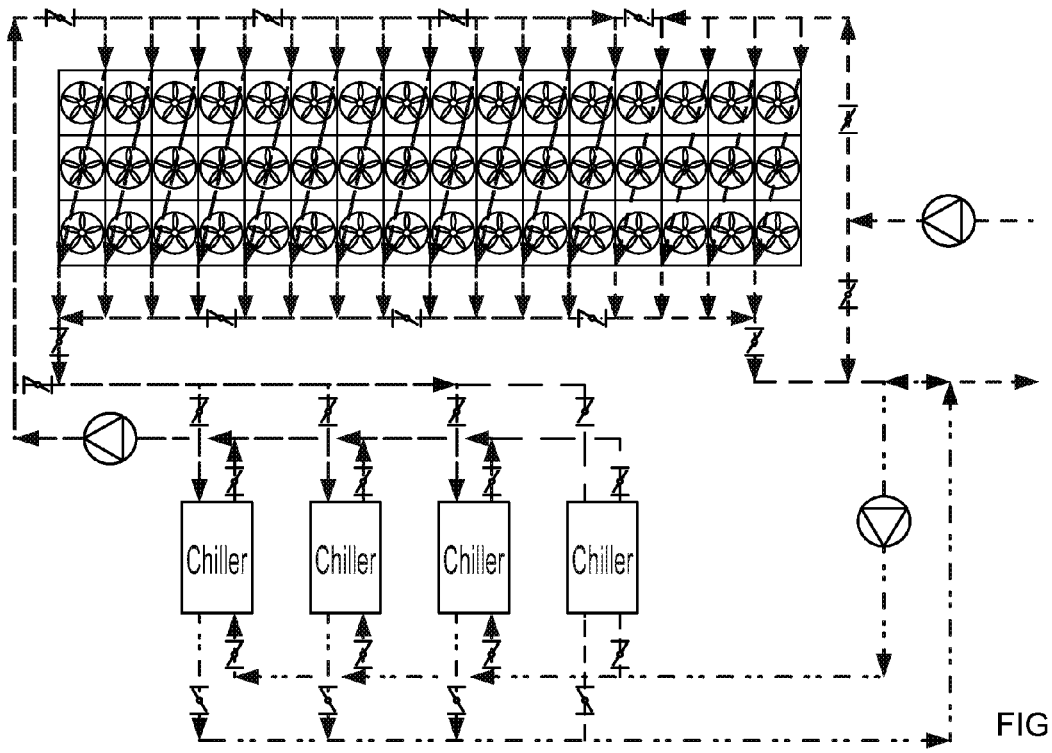
Figure 6F:
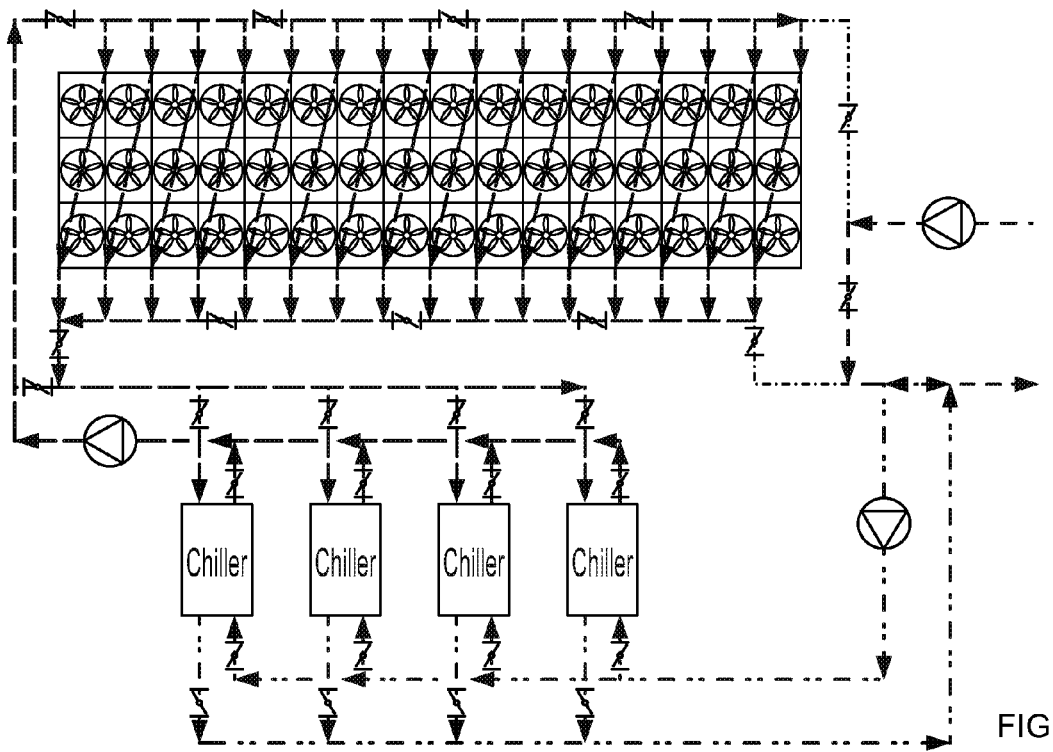

In FIG. 5E, a third chiller has been brought on line, and a proportionate part of the radiator field has been switched over (a bank of four more columns of radiators). In FIG. 5F, the ambient conditions and/or load have increase to the point that all of the chillers are now operating. For example, in this situation, it may be in the afternoon when the outdoor temperature is high. The system modes shown here may thus represent the operation of a system from nighttime, when computing loads are low and outdoor temperatures are also low, to the afternoon, when both are relatively high (though the system may also factor in spikes, such as by predicting a surge of email traffic each morning). The allocation of cooling in the radiator field may return to its state in FIG. 5B as night approaches again. Similar patterns may be seen across the seasons, from winter to summer and back.

FIGS. 6A to 6F are schematic diagrams of a multi-plant air-and-water cooling system that has secondary chiller piping, in various cooling mode. The stages in these figures match the stages and modes of operation in corresponding FIGS. 5A to 5F, though a pump has been added to the chilled water side of the chillers, to provide for additional circulation and control of water in that loop. This secondary chilled water loop may provide additional benefits in the control of the system, as would be understood by a skilled artisan.

In some implementations, the radiators may be implemented as multiple hybrid cooling plants (e.g., cooling towers operating in a dry mode) may be provided for a data facility. The plants may be associated with a set number of server rows inside the facility, such as a single row or two rows. The particular plant may then serve that row or rows or servers for cooling. Additional diversity and redundancy may also be provided by connecting each of the cooling plants to a common header and each of the rows to a common header, so that every row can still access cooling water from the header even if one of the plants goes off line, or if less than full capacity of the cooling plants is needed.

The descriptions here are exemplary only, and are not intended to be limiting in any manner. In addition, the logic flows depicted in the figures do not necessarily require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A method of providing cooling by a cooling system to a computer data center, comprising:
   providing a plurality of air-and-water radiators and one or more chillers, the chillers each having a first side in fluid communication with a chilled water loop and a second side in communication with a condenser water loop, where the plurality of air-and-water radiators are arranged as a grid of x rows and y columns, and each of the air-and-water radiators comprises a fin-and-tube heat exchanger and a fan mounted to circulate an airflow over the fin-and-tube heat exchanger;
   circulating cooled supply water through a common supply header to a plurality of cooling coils positioned in airflow communication with a plurality of computers in the computer data center, the cooling coils receiving heat from the plurality of computers to provide heated water;
   circulating the heated water from the plurality of coiling coils in the computer data center through a common return header as return water;
   dividing the return water from the computer data center into a first portion and a second portion;
   circulating the first portion of return water coming from the computer data center to a first subset of the air-and-water radiators and through the condenser water loop;
   circulating the second portion of the return water from the computer data center to a second subset of the air-and-water radiators and through the chilled water loop, each of the first and second subsets of radiators comprising one or more rows or one or more columns of the plurality of air-and-water radiators in the grid; and
   circulating the first portion and the second portion of the return water to the computer data center as the cooled supply water through the common supply header.

2. The method of claim 1, further comprising selectively proportioning return water to each of the first and second subsets of the air-and-water radiators in response to sensing a change in cooling load for the computer data center.

3. The method of claim 2, wherein selectively proportioning comprises increasing a proportion of water to the second subset relative to a proportion of water to the first subset when an overall load level on the cooling system increases.

4. The method of claim 2, wherein selectively proportioning comprises opening one or more additional banks of radiators for the first subset of radiators when the overall load level increases.

5. The method of claim 1, wherein the first portion of the return water is circulated to the second side of the chillers after it is circulated to the first subset of the air-and-water radiators.

6. The method of claim 5, wherein the second portion of the return water is provided through the chilled water loop to the data center without passing through the chillers.

7. The method of claim 5, wherein the second portion of the return water is blended with water supplied by the chilled water side of the chillers.

8. A cooling system for a computer data center, comprising:
   a chilled water loop that connects loads in the computer data center with chilled water sides of one or more chillers;
   a condenser water loop that connects condenser water sides of the one or more chillers with a plurality of air-and-water radiators, where the plurality of air-and-water radiators are arranged as a grid of x rows and y columns, and each of the air-and-water radiators comprises a fin-and-tube heat exchanger and a fan mounted to circulate an airflow over the fin-and-tube heat exchanger;
   one or more fluid conduits that connect the chilled water loop to the condenser water loop;
   a common supply header in fluid communication with the chilled and condenser water loops, the common supply header circulating cooled supply water to a plurality of cooling coils positioned in airflow communication with the loads in the computer data center and receiving heat from the loads to provide heated water;
   a common return water header in fluid communication with the chilled and condenser water loops, the common return water header circulating the heated water from the plurality of cooling coils in the computer data center to provide warmed return water; and
   one or more control valves in the one or more conduits arranged to divide the warmed return water into relative amounts, and to route the relative amounts of the warmed return water: (1) from the computer data center, through a first sub-set of the air-and-water radiators, and to the chilled water loop, and (2) from the computer data center, through a second sub-set of the air-and-water radiators, and to the condenser water loop.

9. The system of claim 8, further comprising a central control system programmed to control the one or more control valves in response to changes in cooling load on the data center.

10. The system of claim 9, wherein the central control system is programmed to increase a proportion of the warmed return water that is provided to the chilled water loop relative to a proportion of warmed return water that is provided to the condenser water loop when a cooling load on the data center increases.

11. The system of claim 9, wherein the central control system is programmed to stage operation of the one or more chillers in coordination with switching of air-and-water radiators of the plurality of air-and-water radiators from the chilled water loop to the condenser water loop, in response to changes in the cooling load on the computer data center.

12. The system of claim 8, further comprising control valves arranged to selectively isolate the first subset of the air-and-water radiators from the second sub-set of the air-and-water radiators, so that the first subset is connected to the chilled water loop and the second subset is connected to the condenser water loop.

13. The system of claim 8, wherein the common supply header and the common return header each include a conduit having a plurality of taps, with a first plurality of taps connected to piping inside the data center, and a second plurality of taps connected to outputs of the one or more chillers.

14. The system of claim 13, wherein the common return header is connected to inputs of the one or more chillers and inputs of the plurality of air-and-water radiators.

15. The system of claim 8, wherein the chilled water loop comprises a primary chilled water loop and a secondary chilled water loop.

16. The system of claim 15, wherein the primary chilled water loop comprises the chilled water sides of the one or more chillers.

17. The system of claim 8, wherein the y columns comprise four or more columns.

18. A cooling system for a computer data center, comprising:
   one or more chillers that define chilled water sides and condenser water sides;
   a warmed water return conduit arranged to carry warmed water from the computer data center to the cooling system;
   a plurality of air-and-water radiators arranged as a grid of x rows and y columns to receive the warmed water from the computer data center, each of the plurality of air-and-water radiators comprising a fin-and-tube heat exchanger and a fan mounted to circulate an airflow over the fin-and-tube heat exchanger, the plurality of air-and-water radiators arranged to cool the warmed water from the computer data center by circulating the warmed water through tubes of the fin-and tube heat exchangers and circulating, with the fans, ambient air around the tubes;
   a common supply header in fluid communication with the chilled and condenser water sides of the one or more chillers, the common supply header circulating cooled supply water to a plurality of cooling coils positioned in airflow communication with a plurality of computers in the computer data center and receiving heat from the plurality of computers to provide heated water;
   a common return water header in fluid communication with the chilled and condenser water sides of the one more chillers, the common return water header circulating the heated water from the plurality of cooling coils in the computer data center to provide warmed return water; and
   means for dividing the warmed return water into relative amounts and for controlling the relative amounts of the warmed water from the computer data center that is circulated through the air-and-water radiators and through the one or more chillers.

19. The cooling system of claim 18, wherein the warmed water from the data center is circulated through the chilled water sides of the one or more chillers and the condenser water sides of the one or more chillers.

20. The cooling system of claim 19, wherein the warmed water from the data center is circulated through the chilled water sides of the one or more chillers only after it is circulated through the tubes of the air-and-water radiators.

* * * * *